(12) United States Patent
Chandran et al.

(10) Patent No.: US 7,235,886 B1
(45) Date of Patent: Jun. 26, 2007

(54) CHIP-JOIN PROCESS TO REDUCE ELONGATION MISMATCH BETWEEN THE ADHERENTS AND SEMICONDUCTOR PACKAGE MADE THEREBY

(75) Inventors: Biju Chandran, Chandler, AZ (US); Carlos A. Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 146 days.

(21) Appl. No.: 10/023,819

(22) Filed: Dec. 21, 2001

(51) Int. Cl.
*H01L 23/488* (2006.01)

(52) U.S. Cl. .................. 257/778; 174/260; 438/108; 29/840

(58) Field of Classification Search .......... 257/723, 257/737, 738, 778, 779; 361/760, 783, 767–771; 174/260; 29/840; 438/108; 228/180.22
See application file for complete search history.

(56) References Cited

U.S. PATENT DOCUMENTS

| 3,871,015 | A |   | 3/1975 | Lin et al. ............... 257/779 |
|---|---|---|---|---|
| 4,481,403 | A |   | 11/1984 | Del Monte ............. 219/209 |
| 5,308,980 | A | * | 5/1994 | Barton ................. 250/338.4 |
| 5,369,551 | A |   | 11/1994 | Gore et al. ............. 361/767 |
| 5,542,601 | A |   | 8/1996 | Fallon et al. |
| 5,698,465 | A |   | 12/1997 | Lynch et al. ............ 438/125 |
| 5,773,889 | A | * | 6/1998 | Love et al. ............. 257/737 |
| 5,790,377 | A | * | 8/1998 | Schreiber et al. ....... 361/704 |
| 5,872,401 | A |   | 2/1999 | Huff et al. ............. 257/758 |
| 5,889,652 | A |   | 3/1999 | Turturro ............... 361/719 |
| 5,931,371 | A |   | 8/1999 | Pao et al. ............ 228/180.22 |

(Continued)

FOREIGN PATENT DOCUMENTS

| JP | 59-177957 | 10/1984 |
| JP | 08-332590 | 12/1996 |
| JP | 09-275107 | 10/1997 |
| JP | 10-12659 | 1/1998 |

OTHER PUBLICATIONS

Anonymous, "Solder ball for semiconductor chip—has height increased so that stress caused by difference in thermal expansion between chip and substrate is minimised", *Research Disclosure TD-291011*, Derwent 1988–255069, (Jul. 10, 1988), 2 pages.

Hong, B. Z., "Thermal Fatigue Analysis of CBGA Package with Lead–Free Solder Fillets", *Proceedings of the 1998 Intersociety Conference on Thermal Phenomena*, (Aug., 1998), 205–211.

(Continued)

*Primary Examiner*—John B. Vigushin
(74) *Attorney, Agent, or Firm*—Schwegman, Lundberg, Woessner & Kluth, P.A.

(57) ABSTRACT

A chip-join process to reduce elongation mismatch between the adherents involves thermally expanding each of a coefficient of thermal expansion mismatched semiconductor chip and substrate a substantially equal amount from their room temperature state in a direction along surfaces thereof to be joined by soldering. The thermally expanded semiconductor chip and substrate are then soldered to one another forming a plurality of soldered joints, and then cooled to room temperature. The process enables elongation mismatch from soldering to be reduced to less than half that expected based up cooling the substrate and semiconductor chip from the solder solidification temperature following soldering, thereby reducing post soldering residual stress, residual plastic deformation in the soldered joints, residual plastic deformation in the substrate, and semiconductor chip warpage.

29 Claims, 4 Drawing Sheets

(1 of 4 Drawing Sheet(s) Filed in Color)

U.S. PATENT DOCUMENTS

| | | | | |
|---|---|---|---|---|
| 5,936,304 | A | | 8/1999 | Lii et al. ................... 257/778 |
| 6,002,590 | A | * | 12/1999 | Farnworth et al. .......... 361/749 |
| 6,014,317 | A | * | 1/2000 | Sylvester ................... 361/760 |
| 6,049,124 | A | | 4/2000 | Raiser et al. ............... 257/737 |
| 6,162,660 | A | | 12/2000 | LaFontaine, Jr. et al. ... 438/108 |
| 6,170,155 | B1 | | 1/2001 | Marion et al. ................ 29/840 |
| 6,191,952 | B1 | * | 2/2001 | Jimarez et al. ............. 361/771 |
| 6,222,277 | B1 | * | 4/2001 | Downes ...................... 257/778 |
| 6,259,155 | B1 | | 7/2001 | Interrante et al. ........... 257/690 |
| 6,310,403 | B1 | | 10/2001 | Zhang et al. ................ 257/786 |
| 6,320,754 | B1 | * | 11/2001 | Dauksher et al. ........... 361/760 |
| 6,330,967 | B1 | | 12/2001 | Milewski et al. ...... 228/180.22 |
| 6,365,435 | B1 | | 4/2002 | Wang et al. |
| 6,395,124 | B1 | | 5/2002 | Oxman et al. ........... 156/275.5 |
| 6,402,012 | B1 | | 6/2002 | Bolduc .................. 228/180.22 |
| 6,472,762 | B1 | * | 10/2002 | Kutlu ......................... 257/778 |
| 6,555,052 | B2 | | 4/2003 | Soga et al. ................... 420/560 |
| 6,581,821 | B2 | * | 6/2003 | Sarkhel ................. 228/180.21 |
| 6,664,637 | B2 | * | 12/2003 | Jimarez et al. ............. 257/772 |
| 6,689,635 | B1 | | 2/2004 | Cobbley et al. |
| 6,798,072 | B2 | | 9/2004 | Kajiwara et al. |
| 6,847,118 | B2 | | 1/2005 | Milewski et al. |
| 2001/0008309 | A1 | * | 7/2001 | Iijima et al. ................ 257/737 |
| 2002/0140094 | A1 | | 10/2002 | Kubota et al. |
| 2002/0155637 | A1 | | 10/2002 | Lee |
| 2002/0195707 | A1 | * | 12/2002 | Bernier et al. .............. 257/738 |
| 2003/0003624 | A1 | | 1/2003 | Farooq et al. |
| 2004/0227256 | A1 | | 11/2004 | Seko |

OTHER PUBLICATIONS

Karim, Z. S., et al., "Lead–Free Bump Interconnections for Flip–Chip Applications", *Proceedings of the 2000 IEEE/CPMT International Electronics Manufacturing Technology Symposium*, (Jan., 2000),274–278.

Wang, T., et al., "Studies on A Novel Flip–Chip Interconnect Structure–Pillar Bump", *Proceedings of the 2001 Electronic Components and Technology Conference*, (Apr., 2001),5 p.

Xiao, G., et al., "The Effect of Cu Stud Structure and Eutectic Solder Electroplating on Intermetallic Growth and Reliability of Flip–Chip Solder Bump", *Proceedings of the 2000 Electronic Components and Technology Conference*, (Sep., 2000),54–59.

\* cited by examiner

CHIP-JOIN PROCESS TO REDUCE ELONGATION MISMATCH BETWEEN THE ADHERENTS AND SEMICONDUCTOR PACKAGE MADE THEREBY

FIELD

The invention relates to an electronic assembly and a method of making the same. More particularly, the invention relates to an improved method of soldering a semiconductor chip to a substrate and to the semiconductor package made thereby.

BACKGROUND

Figure 7A:
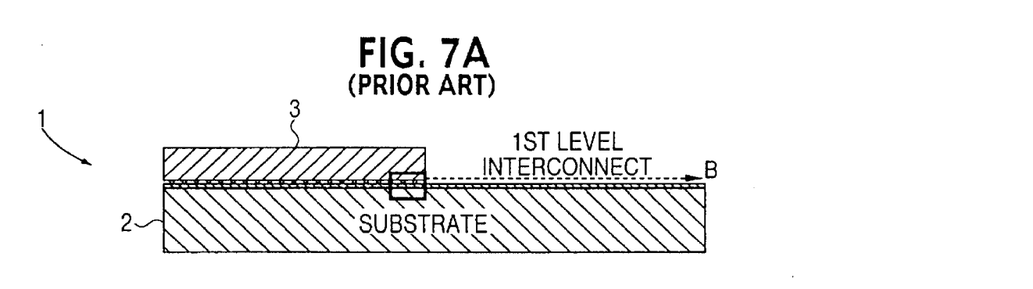
FIG. 7A is a schematic, cross sectional view through the right half, from the center line CL to the right, of a conventional package.
Figure 7B:
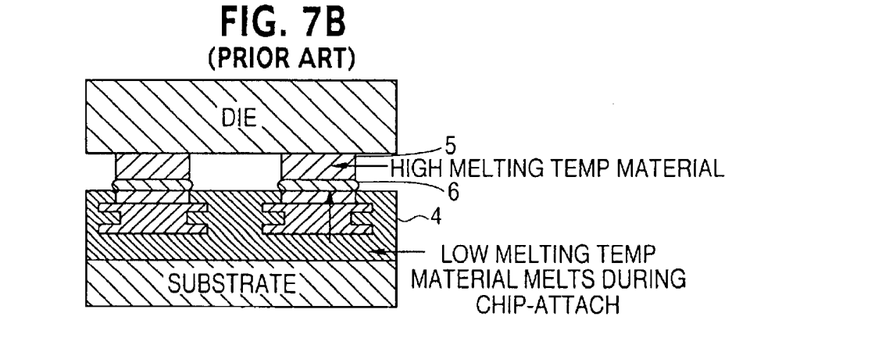
FIG. 7B is an enlarged view of the portion of the semiconductor package of FIG. 7A within the box B in FIG. 7A.

A conventional semiconductor package 1 illustrated in FIGS. 7A and 7B includes a package substrate 2 and a semiconductor chip or die 3 located on the substrate. The lower or frontside of the chip carries an integrated circuit which has a plurality of sites or connections for purposes of electrically contacting the integrated circuit to respective contact pads 4 on the package substrate, electronically connecting the chip to the package substrate. More particularly, the die has standoff 5 mounted thereon The standoff are formed of an electrically conductive, high melting temperature material, such as copper. The standoffs are electrically connected to the respective sites or connections of the integrated circuit on the chip. Soldered joints 6 in turn join the die standoffs to the contact pads on the package substrate. The soldered joints are formed in the conventional assembly process wherein the die with standoffs and the substrate with contact pads to which solder has been previously applied, are located in contact with one another and heated together to a temperature higher than the solder melting temperature and allowed to cool-down together. The solder on the contact pads of the substrate is reflowed during this joining process to wet the standoffs and form the soldered joints.

The semiconductor chip in the conventional semiconductor package is typically made of silicon, which has a coefficient of thermal expansion (CTE) of about 2.6–3.3 ppm/° C. (parts per million per ° C.). In the past, the package substrate was generally made of a ceramic material, which has a CTE that is typically below 6 ppm/° C. During heating or cooling of the semiconductor package, including that associated with soldering during assembly of the package, the mismatch of the CTEs of the semiconductor chip and the package substrate was not of a magnitude which caused substantial bending of the semiconductor chip. Nevertheless, this mismatch can still present problems, especially in brittle materials from residual stresses as a result of soldering.

In recent years, there has been a move away from the use of ceramic as a package substrate material to alternative materials, such as plastics or other organic materials, which have lower cost, superior electrical characteristics. A problem with these alternate materials is that they usually have relatively high CTEs, compared to the CTE of the semiconductor chip. Some plastic substrates, for example, have CTEs on the order of 17 ppm/° C. The relatively larger CTE mismatch in packages using the higher CTE package substrate materials can induce adverse effects such as solder fatigue, package and die warpage, die cracking, etc. These problems can occur at the time of joining the chip to the substrate or subsequently during the operating life of the package.

Numerous proposals have been made to reduce the problems arising from CTE mismatch in package materials. For example, U.S. Pat. No. 5,369,551 proposes a surface mount stress relief interface system and method wherein a compliant interface device is connected to both the substrate and chip for obviating CTE mismatch. In Assignee's U.S. Pat. No. 5,889,652, a bond portion of the substrate is separated from a contact portion of the substrate by a flexible portion to allow relative movement to minimize the stresses on the solder joints.

U.S. Pat. No. 5,931,311 discloses a standoff controlled interconnection for use in a soldering process to reduce solder joint plastic deformation caused by CTE mismatch. The patentees explain that the larger the standoff, the less plastic deformation that occurs, thus leading to a longer component/interconnection durability and cycles life.

Another approach taken to reduce the effect of CTE mismatch on the life of the semiconductor package involves reinforcement of the chip against warpage. For example, the use of a protective layer on the backside of the die is suggested in Assignee's U.S. Pat. No. 5,936,304. In a further example, the semiconductor chip is provided with beveled edges which, together with an epoxy located thereon, reduce stresses on the chip when the package is heated, as disclosed in Assignee's U.S. Pat. No. 6,049,124.

The problems related to CTE mismatch induced effects on semiconductor packages have become more pronounced as dies have become larger because of the increased distance from the center of the die to sites at which the die and substrate are joined to one another. There is a need for an improved method of joining CTE mismatched materials and an electronic assembly/semiconductor package made thereby, wherein CTE mismatch induced effects such as solder fatigue, package and die warpage, die cracking, etc., are reduced or minimized.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

FIGS. 3A–3C and 3D–3E are respectively color coded temperature distributions on a die and the substrate made according to the method of FIG. 2 at different times, e.g., wherein FIGS. 3A–3C are for the time one second after the die is placed on the substrate, and FIG. 3A is a cross sectional view through a portion of the die and substrate assembly, FIG. 3B is a view of the right end of the substrate in FIG. 3A and FIG. 3C is an enlarged view of the joint area within box A in FIG. 3A, and wherein FIGS. 3D–3E are for the time 10 minutes into cooling and FIG. 3D is a cross sectional view through a portion of the assembly and FIG. 3E is an end view of the right side of the substrate shown in FIG. 3D.

DETAILED DESCRIPTION

The improved method of the invention of joining first and second CTE mismatched members to one another addresses the aforementioned need by reducing the elongation mismatch produced during cool-down after joining the members at an elevated temperature, by soldering in the example embodiment. Unlike the conventional method described above with reference to FIGS. 7A and 7B, wherein during soldering the members are heated together to a temperature higher than the solder melting temperature and allowed to cool-down together, the present invention is based upon the principle that when two adherents are attached at higher temperature, if they have the same elongation at the temperature at which the adhesive/solder solidifies, both adherents will contact the same amount and, hence, no stresses will be induced. For CTE matched adherents, the condition that the elongation of the adherents be equal will be true at any temperature. For CTE mismatched adherents, the adherents will have to be at different temperatures for this condition to hold. The method of the present invention exploits this principle by thermally expanding each of CTE mismatched members substantially the same amount in a direction along surfaces thereof to be joined at an elevated temperature, and thereafter joining the thermally expanded members to one another.

In the example embodiment as depicted in FIGS. 1–3E, the two members are a semiconductor chip 7 and a substrate 8 which are joined to one another by soldering to form a semiconductor package 9. The die and substrate are at different uniform temperatures at the instant they are brought together for soldering. They are then allowed to cool-down together to room temperature. The temperatures of the die and the substrate are calculated so that their thermal expansions or elongations are substantially the same at the temperature the solder solidifies.

Figure 1:
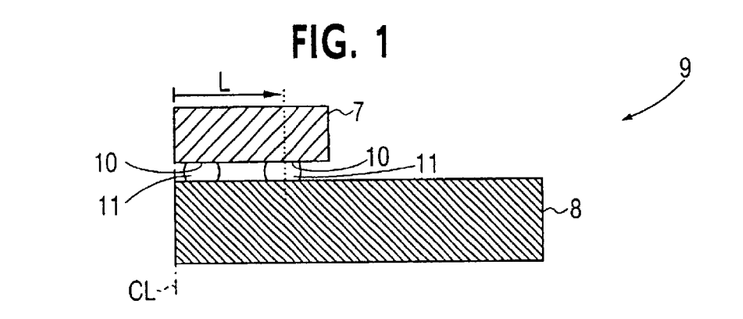
FIG. 1 is a schematic, sectional view of the right half, from the center line CL, of an assembly of a die on a substrate.

The technical basis underlying the present invention is explained with reference to FIG. 1 wherein the chip or die 7 is joined to the substrate 8 by a plurality of soldered joints 10. The CTEs of the die, $\alpha_{die}$ and the substrate, $\alpha_{sub}$, are different, e.g., in the example embodiment the difference between the CTEs is greater than 2.7 ppm/° C. More particularly, in the example embodiment it is assumed $\alpha_{die}$ is 2.6 ppm/° C. and $\alpha_{sub}$ is 16 ppm/° C. The temperatures of the die and substrate at the instant the die is coupled to the substrate (when the melting solder is on the die, $T_{die}=T_{melting}$ of solder) are denoted by $T_{die}$ and $T_{sub}$, respectively. The parameter L in FIG. 1 is the half length of the die (or more precisely the distance from the center of the die to the outermost bump or soldered joint 10). At the solder solidification temperature (or solder melting temperature in the case of eutectic solders), the elongation of the die, $\Delta l_{die}$, and that of the substrate, $\Delta l_{sub}$ (at the region of the outermost soldered joint 10), are expressed by:

$$\Delta l_{die}=\alpha_{die}(T_{die}-T_{room})L \quad (1)$$

$$\Delta l_{sub}=\alpha_{sub}(T_{sub}-T_{room})L \quad (2)$$

If $\Delta l_{die}$ and $\Delta l_{sub}$ are equal, then, when the soldered assembly cools down to room temperature, the die and the substrate would have contracted as much as they expanded (almost), and there will be no CTE mismatch induced effects (ideal case) from the joining method.

For that to happen, $$\Delta l_{die}=\Delta l_{sub}=\alpha_{die}(T_{die}-T_{Room})L=\alpha_{sub}(T_{sub}-T_{Room})L, \quad (3)$$

i.e., $$\frac{T_{die}^{aboveroom}}{T_{sub}^{aboveroom}}=\frac{\alpha_{sub}}{\alpha_{die}}=\frac{16 \text{ ppm/°C.}}{2.6 \text{ ppm/°C.}}=6.15 \quad (4)$$

Considering the example case of the package 9 being soldered with a eutectic AgSn solder which has a melting point of 221° C. wherein the solder is on the die side before joining, and a copper bump or standoff 11 is on the substrate side, the temperature of the die for soldering $T_{die}$ has to be at least 221° C. Assuming that $T_{die}$ is selected to be 240° C. in the joining method according to the invention, then the substrate temperature $T_{sub}$ has to be 57.4° C. for the die and substrate to be thermally expanded substantially the same amount in a direction along the surfaces thereof to be joined by soldered joints 10.

Figure 2:
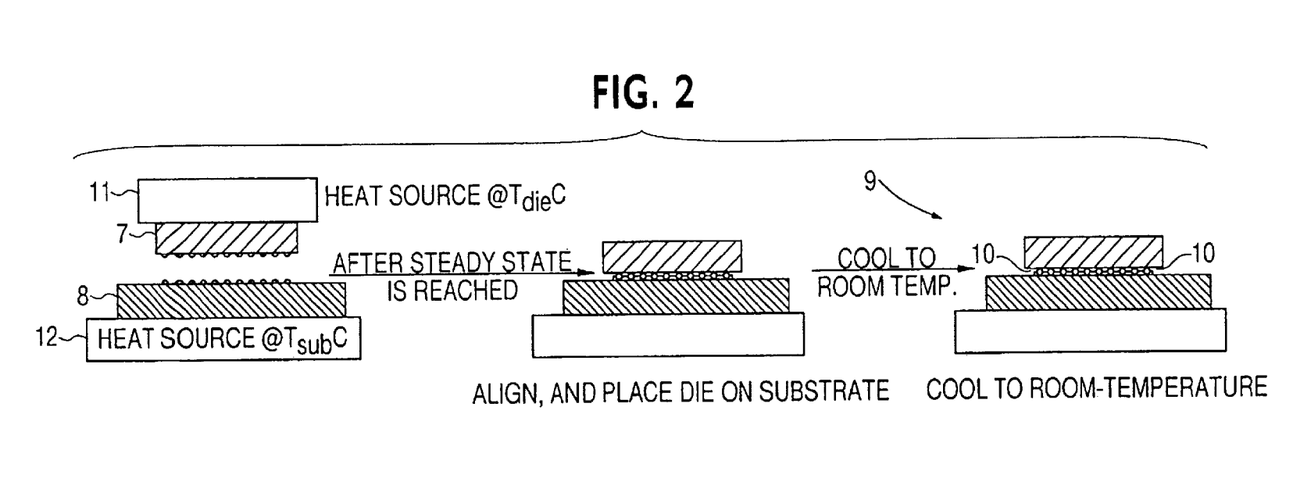
FIG. 2 is a schematic representation of a method of an example embodiment of the present invention for making a semiconductor package according to the invention.
Figures 3A, 3C:
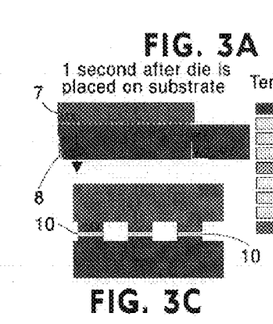
Figures 3B, 3D, 3E:
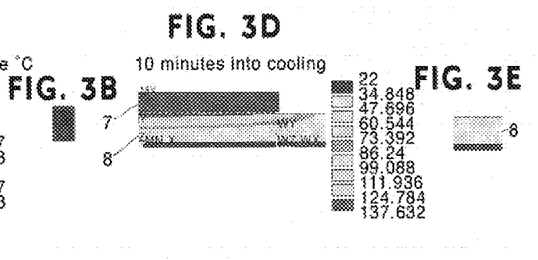

The method of the example embodiment of the invention is illustrated in FIG. 2, wherein, as depicted in the left hand drawing of FIG. 2, the die 7 and substrate 8 are separately heated by respective heat sources 11 and 12. In particular, the die with eutectic AgSn solder at the connection sites thereon is heated by heat source 11 to 240° C. and the substrate 8 is heated by heat source 12 to 57.4° C. so that they are each thermally expanded substantially the same amount. These temperatures are a function of the soldering temperature and the ratio of the coefficients of thermal expansion of $\alpha_{sub}/\alpha_{die}$, which ratio is 6.15 in the example. After the die and substrate are uniformly heated to their respective temperatures, they are aligned and the die is placed on the substrate as shown schematically in the center drawing in FIG. 2. The soldered joints 10 are formed between the die and substrate upon assembly because the molten solder on the die wets the surfaces of the copper bumps on the substrate and is then solidified. The joined assembly is then cooled to room temperature, denoted by the right hand drawing in FIG. 2.

FIGS. 3A–3E show temperature distribution in a transient thermal model of the example embodiment. At time zero in the method of the invention, the die and the AgSn solder thereon are at 240° C., and the substrate and substrate standoffs or bumps thereon are at 57.4° C. In this example, the assembly process (the time the die is on the substrate before cooling is allowed to begin) is assumed to take place for 10 seconds. During this time, heat conduction through the substrate bumps takes place and local regions of the substrate near the bumps get heated up (changing the condition from ideal). The longer the time the die is kept on the substrate before cooling is allowed to begin (this roughly translates to the time heat is applied to the die before it is removed), the case will deviate more from optimal. Following the assembly process, the die and the package are allowed to cool to room temperature in air. FIGS. 3A–3E show the temperature distribution in the package at different times in the assembly step and cooling step, namely one second after the die is placed on the substrate, FIGS. 3A–3C, and 10 minutes into cooling, FIGS. 3D and 3E.

Figure 4:
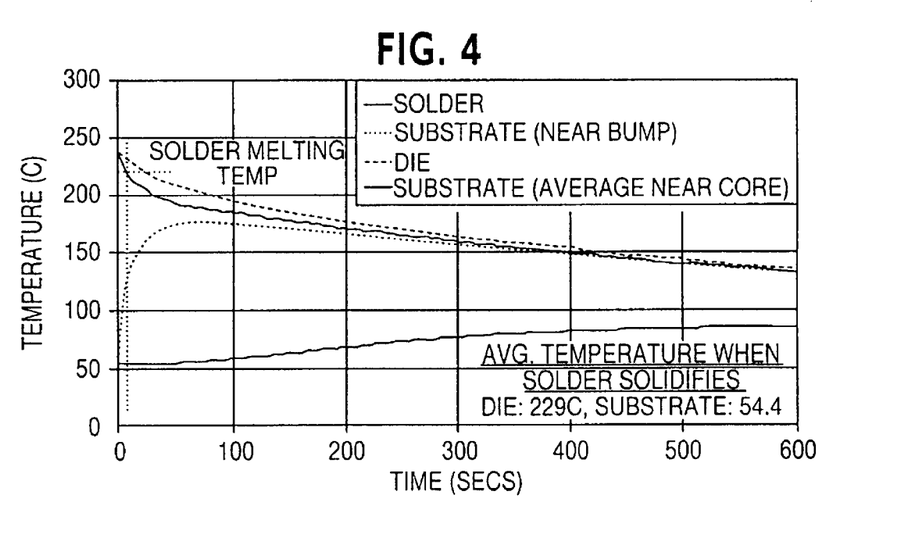
FIG. 4 is a graph of temperature versus time at representative regions of the package during the method of the invention as derived from a simulation using a transient thermal model of the example embodiment.

FIG. 4 graphically depicts the temperature distribution in representative regions of the package 9 during cooling At the instant the solder temperature cools below 221° C. (the melting/solidous temperature), relative motion is prevented between the die and the substrate and they form an assembly. It is noted that in this example, which deviates from the ideal, the temperature in the die and the substrate at every instant in the cooling step is not such that their Δl's are the same. This means that there is some residual plastic deformation being built up in the soldered joints during cooling, changing the case from optimal. A cooling scheme can potentially be derived to reduce this deviation from the optimal condition. In any event, for the example embodiment, it is emphasized that the stress and warpage associated with the semiconductor package of the present invention after cooling it to room temperature are substantially reduced in comparison with those for the same case if the die and substrate were attached using the conventional process. This can be seen from a consideration of FIG. 5.

Figure 5:
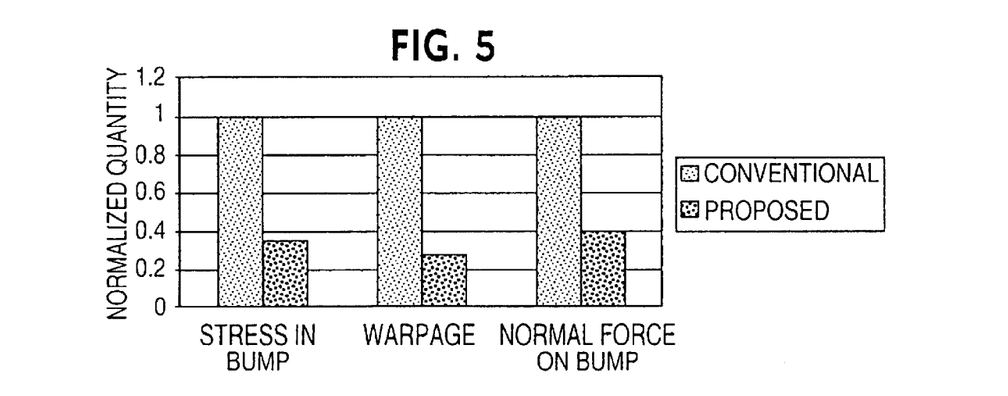
FIG. 5 is a graph of stress and warpage for the semiconductor package of the example embodiment obtained by simulation using the transient thermal model compared with those for the same package made using the conventional process.

FIG. 5 compares the stresses in critical regions and die surface warpage for the example embodiment assembled using the described assembly method of the invention, and for the assembly of the same components joined by the conventional reflow process. Results indicate a significant improvement with the package of the invention as stresses and warpage as well as the normal force on the bump are reduced to less than one-half that in the package made by the conventional method wherein the substrate and semiconductor chip are cooled together from the solder solidification temperature to room temperature following soldering of the soldered joints. The magnitude of the stresses and the warpage for the semiconductor package made according to the method of the present invention can be further decreased by reducing the time the assembly process takes (the time the die is heated after it is placed on the substrate). This time will correspond to the time the hot chuck, 11 in FIG. 2, is in contact with the die after it has been placed on the substrate, and the temperature above solder melting temperature to which the die and solder thereon are heated.

Figure 6:
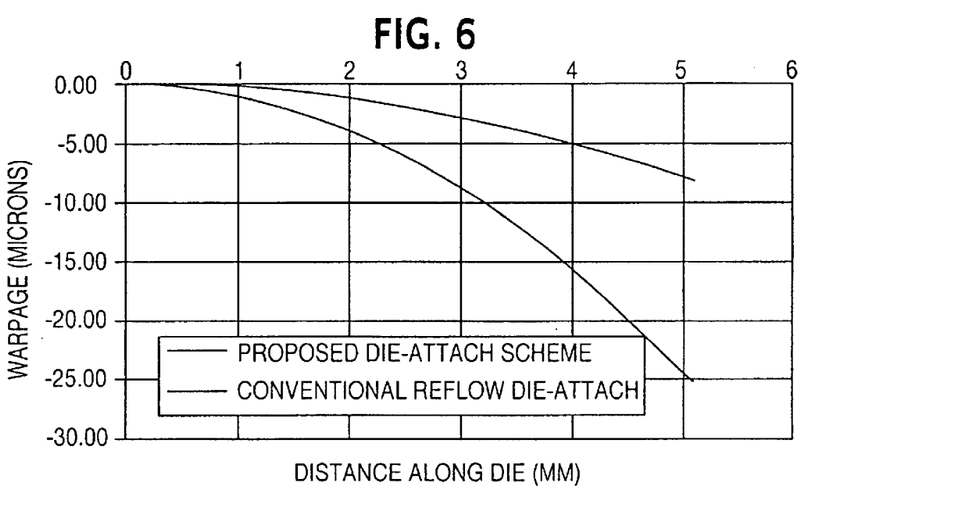
FIG. 6 is a graph of the surface warpage, obtained by simulation using the transient thermal model, versus distance along the die from the center of the die for the example embodiment compared with the warpage for the same package made using the conventional method.

FIG. 6 illustrates the die surface warpage as a function of distance along the die from the center of the die to the soldered joint for the package of the example embodiment compared with the warpage for the same package made using the conventional process as referred to herein. It is seen that the warpage is less with the semiconductor package of the present invention as compared with that prepared by the conventional reflow die-attach process. In each case, warpage is seen to increase as a function of the distance from the center of the die. This evidences the fact that by means of the method of the present invention, the warpage experienced with large dies (such as those having a width of 200 mm, for example, where soldered joints are a considerable distance from the die center) can be reduced substantially when made by the method of the present invention.

This concludes the description of the example embodiment. Although the present invention has been described with reference to one illustrative embodiment thereof, it should be understood that numerous other modifications and embodiments can be devised by those skilled in the art that will fall within the spirit and scope of the principles of this invention. For example, the thermal expansion before soldering is the same for the chip and substrate in the example embodiment but significant benefit can be obtained if the expansions are not Identical but at least substantially the same, e.g., within ±25% of one another or not differing by more than 2 ppm/° C. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:

1. A method of soldering a coefficient of thermal expansion mismatched semiconductor chip and substrate to one another, the method comprising:

thermally expanding each of the semiconductor chip and the substrate substantially a same amount in a direction along surfaces thereof to be joined by soldering; and soldering the thermally expanded semiconductor chip and the substrate to one another.

2. The method according to claim 1, wherein the thermally expanding includes heating the semiconductor chip to at least a soldering temperature for soldering the chip and the substrate.

3. The method according to clam 1, wherein the thermally expanding comprises separately heating the chip and the substrate to different temperatures as a function of the mismatch of their coefficients of thermal expansion and thereafter assembling the chip and the substrate in contact with one another for the soldering.

4. The method according to claim 1, wherein the soldering includes assembling the thermally expanded semiconductor chip and the substrate in contact with one another via a solder to form a soldered assembly, and wherein the method further comprises cooling the soldered assembly to room temperature.

5. The method according to claim 1, further comprising applying a solder to the semiconductor chip prior to thermally expanding the chip, and wherein the soldering includes contacting the solder on the thermally expanded chip with the substrate to wet the substrate and form at least one soldered joint.

6. The method according to claim 1, wherein the substrate comprises a plurality of standoff elements upstanding from a surface of the substrate, and wherein the soldering includes forming a plurality of soldered joints connecting the thermally expanded semiconductor chip to tops of respective ones of the standoff elements on the thermally expanded substrate.

7. The method according to claim 6, wherein the standoff elements are non-melting at a the soldering temperature.

8. The method according to claim 1, wherein the soldering includes simultaneously forming a plurality of soldered joints between the semiconductor chip and the substrate.

9. The method according to claim 1, wherein the soldering includes making a plurality of soldered joints between the chip and the substrate along the chip over a distance of at least 4 mm from a center of the chip.

10. A method of joining first and second coefficient of thermal expansion mismatched members to one another, the method comprising:

thermally expanding each of the first and second members substantially a same amount in a direction along surfaces thereof to be joined;

joining the thermally expanded first and second members to one another at an elevated temperature; and cooling the joined first and second members to room temperature.

11. The method according to claim 10, wherein the thermally expanding includes heating a member of the first and second members having a lower coefficient of thermal expansion to at least the elevated temperature at which the joining takes place.

12. The method according to claim 10, wherein the thermally expanding comprises separately heat each of the first and second members to respective temperatures as a function of the mismatch of their coefficients of thermal expansion and thereafter assembling the members in contact with one another for the joining.

13. The method according to claim 10, wherein the joining at the elevated temperature is by soldering.

14. An electronic assembly comprising:
a substrate having a first coefficient of thermal expansion;
a semiconductor chip having a second coefficient of thermal expansion which is different than the first coefficient of thermal expansion;
a plurality of soldered joints connecting the semiconductor chip and the substrate;
wherein the chip and the substrate across the plurality of soldered joints of the electronic assembly at room temperature have coefficient of thermal expansion difference induced elongation mismatches and stresses induced thereby in the electronic assembly from soldering; and
wherein a magnitude of the elongation mismatches and the stresses induced thereby in the electronic assembly is less than one-half that expected based upon cooling the substrate and the semiconductor chip from a solder solidification temperature to the room temperature following soldering of the plurality of soldered joints.

15. The electronic assembly according to claim 14, wherein the elongation mismatches and the stresses induced thereby in the electronic assembly are reflected in the electronic assembly by at least one of post-soldering residual stress, residual plastic deformation in the plurality of soldered joints, residual plastic deformation in the substrate, and semiconductor chip warpage.

16. The electronic assembly according to claim 14, wherein the first coefficient of thermal expansion of the substrate is more than two times greater than the second coefficient of thermal expansion of the semiconductor chip.

17. The electronic assembly according to claim 14, wherein the semiconductor chip is jointed by the plurality of soldered joints to the substrate along the chip over a distance of at least 4 mm from a center of the chip 18. The electronic assembly according to claim 14, wherein the plurality of soldered joints each comprise solder on the semiconductor chip that is wetted onto a surface of the substrate to form the soldered joint. onto a surface of the substrate to form the soldered joint.

19. An electronic assembly comprising:
a substrate having a first coefficient of thermal expansion;
a semiconductor chip having a second coefficient of thermal expansion which is different than the first coefficient of thermal expansion;
a plurality of soldered joints connecting the semiconductor chip and the substrate;
wherein the chip and the substrate across the plurality soldered joints of the electronic assembly at room temperature have coefficient of thermal expansion difference induced elongation mismatches from soldering; and
wherein a magnitude of the elongation mismatches is less than one-half that expected based upon cooling the substrate and the semiconductor chip from a solder solidification temperature to the room temperature following soldering of the plurality of soldered joints; and
wherein the substrate comprises a plurality of standoff elements upstanding from a surface of the substrate, and wherein the plurality of soldered joints connect the semiconductor chip to tops of respective ones of the plurality of standoff elements.

20. The electronic assembly according to claim 19, wherein the standoff elements are non-melting at a solder liquidous temperature.

21. The electronic assembly according to claim 19, wherein the plurality of standoff elements are copper bumps.

22. A semiconductor package comprising:
a package substrate having a first coefficient of thermal expansion of at least 15 ppm/° C., the package substrate having a plurality of contact members;
a semiconductor chip having a coefficient of thermal expansion which is at least 2.7 ppm/° C. less than the coefficient of thermal expansion of the package substrate, a front side of the chip having a plurality of solder connections thereon, the semiconductor chip being located on the substrate with plurality of the solder connections connected to respective ones of the plurality of contact members by soldered joints electrically coupling the semiconductor chip to the package substrate;
wherein the semiconductor chip and package substrate across the respective soldered joints of the semiconductor package at room temperature have coefficient of thermal expansion difference induced elongation mismatches and stresses induced thereby in the semiconductor package from soldering; and
wherein a magnitude of the elongation mismatches and the stresses induced thereby in the semiconductor package is less than one-half that expected based upon cooling the substrate and the semiconductor chip from a solder solidification temperature to the room temperature following the soldering of the soldered joints.

23. The semiconductor package according to claim 22, wherein the elongation mismatches and the stresses induced thereby in the semiconductor package are reflected in the semiconductor package by at least one of post-soldering residual stress, residual plastic deformation in the soldered joints, residual plastic deformation in the substrate, and semiconductor chip warpage.

24. The semiconductor package according to claim 22, wherein the first coefficient of thermal expansion of the substrate is more than two times greater than the second coefficient of thermal expansion of the semiconductor chip.

25. The semiconductor package according to claim 22, wherein the semiconductor chip is joined by soldered joints to the substrate along the chip over a distance of at least 4 mm from a center of the chip.

26. The semiconductor package according to claim 22, wherein the soldered joints each comprise solder on the semiconductor chip that is wetted onto a surface of a contact member of the substrate to form a soldered joint.

27. A semiconductor package comprising:
a package substrate having a first coefficient of thermal expansion of at least 15 ppm/° C., the package substrate having a plurality of contact members;
a semiconductor chip having a coefficient of thermal expansion which is at least 2.7 ppm/° C. less than the coefficient of thermal expansion of the package substrate, a front side of the chip having a plurality of solder connections thereon, the semiconductor chip being located on the substrate with the plurality of solder connections connected to respective ones of the plurality of contact members by soldered joints electrically coupling the semiconductor chip to the package substrate;

wherein the semiconductor chip and the package substrate across the respective soldered joints of the semiconductor package at room temperature have coefficient of thermal expansion difference induced elongation mismatches from soldering; and wherein a magnitude of the elongation mismatches is less than one-half that expected based upon cooling the substrate and the semiconductor chip from a solder solidification temperature to a room temperature following the soldering of the soldered joints; and wherein the plurality of contact members comprise a plurality of standoff elements upstanding from a surface of the substrate, and wherein the soldered joints connect the semiconductor chip to tops of respective ones of the plurality of standoff elements.

28. The semiconductor package according to claim 27, wherein the plurality of standoff elements are non-melting at a solder liquidous temperature.

29. The semiconductor package according to claim 27, wherein the plurality of standoff elements are copper bumps.

* * * * *

UNITED STATES PATENT AND TRADEMARK OFFICE
CERTIFICATE OF CORRECTION

PATENT NO. : 7,235,886 B1  
APPLICATION NO. : 10/023819  
DATED : June 26, 2007  
INVENTOR(S) : Chandran et al.

Page 1 of 1

It is certified that error appears in the above-identified patent and that said Letters Patent is hereby corrected as shown below:

Title page, Item (56), under "Other Publications", in column 2, line 4, delete "TD–291011" and insert -- RD–291011 --, therefor.

Title page, Item (57), under "Abstract", in column 2, line 11, delete "up" and insert -- upon --, therefor.

In column 6, line 17, in Claim 3, delete "clam 1" and insert -- claim 1 --, therefor.

In column 6, line 43, in Claim 7, after "at a" delete "the".

In column 6, line 67, in Claim 12, delete "heat" and insert -- heating --, therefor.

In column 7, line 39, in Claim 17, delete "jointed" and insert -- joined --, therefor.

In column 7, lines 45-46, in Claim 18, after "solder joint." delete "onto a surface of the substrate to form the soldered joint.". (Second Occurrence)

In column 7, line 56 (Approx.), in Claim 19, before "soldered" insert -- of --.

In column 8, line 24 (Approx.), in Claim 22, after "and" insert -- the --.

Signed and Sealed this

Thirtieth Day of October, 2007

JON W. DUDAS  
*Director of the United States Patent and Trademark Office*